(12) United States Patent
Morita et al.

(10) Patent No.: US 9,203,448 B2
(45) Date of Patent: Dec. 1, 2015

(54) WIRELESS COMMUNICATION APPARATUS

(75) Inventors: Tadashi Morita, Kanagawa (JP); Naganori Shirakata, Kanagawa (JP)

(73) Assignee: Panasonic Corporation, Osaka (JP)

( * ) Notice: Subject to any disclaimer, the term of this patent is extended or adjusted under 35 U.S.C. 154(b) by 56 days.

(21) Appl. No.: 14/001,061

(22) PCT Filed: Feb. 27, 2012

(86) PCT No.: PCT/JP2012/001329
§ 371 (c)(1),
(2), (4) Date: Aug. 22, 2013

(87) PCT Pub. No.: WO2012/132222
PCT Pub. Date: Oct. 4, 2012

(65) Prior Publication Data
US 2013/0329832 A1 Dec. 12, 2013

(30) Foreign Application Priority Data

Mar. 31, 2011 (JP) ................................. 2011-080288

(51) Int. Cl.
*H04K 1/02* (2006.01)
*H04L 25/03* (2006.01)
*H04L 25/49* (2006.01)
(Continued)

(52) U.S. Cl.
CPC ............ *H04B 1/0475* (2013.01); *H03F 1/3241* (2013.01); *H04B 2001/0433* (2013.01)

(58) Field of Classification Search
CPC ................ H03F 1/3247; H03F 1/3294; H03F 2201/3233; H04L 27/368; H04L 25/03343; H04L 1/243; H04L 1/0001; H04L 1/0009; H04L 1/1854; G01R 31/31716

USPC ..................... 375/219–236, 295–297; 379/3, 379/406.01–406.16
See application file for complete search history.

(56) References Cited

U.S. PATENT DOCUMENTS

| 6,845,126 B2 * | 1/2005 | Dent et al. ..................... 375/219 |
| 7,155,180 B2 * | 12/2006 | Kim et al. .................. 455/114.2 |
| 7,170,342 B2 | 1/2007 | Suzuki et al. |

(Continued)

FOREIGN PATENT DOCUMENTS

| JP | 08-204605 A | 8/1996 |
| JP | 2001-016145 A | 1/2001 |

(Continued)

OTHER PUBLICATIONS

International Search Report, mailed Apr. 10, 2012, for PCT/JP2012/001329, 4 pages.

*Primary Examiner* — James M Perez
(74) *Attorney, Agent, or Firm* — Seed IP Law Group PLLC

(57) ABSTRACT

A transmission RF section (101) up-converts a DA-converted test signal into a high-frequency signal. An amplitude of the high-frequency signal, an envelope of which is detected by a loop-back section, is detected by an amplitude detector (400). An inverse characteristic calculator (402) converts the detected amplitude into an amplitude in the transmission RF section (101) using an inverse conversion table (407) and then calculates amplitude inverse characteristics. An FIR filter (103) corrects a signal band of a transmission signal based on a result of an inverse Fourier transform calculated by an IFFT section (405) based on the amplitude inverse characteristics as a variable factor.

5 Claims, 15 Drawing Sheets

(51) Int. Cl.
*H04B 1/04* (2006.01)
*H03F 1/32* (2006.01)

(56) References Cited

U.S. PATENT DOCUMENTS

| | | | |
|---|---|---|---|
| 7,319,724 B2* | 1/2008 | Kishi | 375/297 |
| 7,672,364 B2* | 3/2010 | Kang et al. | 375/221 |
| 7,826,808 B2* | 11/2010 | Faulkner | 455/114.2 |
| 8,213,884 B2 | 7/2012 | Kim et al. | |
| 8,284,824 B1* | 10/2012 | Smaini et al. | 375/221 |
| 8,665,938 B2* | 3/2014 | Yu et al. | 375/228 |
| 8,897,735 B2* | 11/2014 | Kim et al. | 455/295 |
| 2004/0106380 A1* | 6/2004 | Vassiliou et al. | 455/73 |
| 2004/0116083 A1* | 6/2004 | Suzuki et al. | 455/126 |
| 2006/0035601 A1* | 2/2006 | Seo | 455/78 |
| 2007/0147527 A1* | 6/2007 | Egashira et al. | 375/260 |
| 2009/0146736 A1 | 6/2009 | Kim et al. | |
| 2010/0277236 A1* | 11/2010 | Horiguchi et al. | 330/149 |
| 2012/0230176 A1* | 9/2012 | Komninakis et al. | 370/201 |
| 2013/0201050 A1* | 8/2013 | Hellsten | 342/21 |
| 2014/0134943 A1* | 5/2014 | Hobbs et al. | 455/9 |
| 2014/0192923 A1* | 7/2014 | Matsuo et al. | 375/296 |

FOREIGN PATENT DOCUMENTS

| | | |
|---|---|---|
| JP | 2005-065211 A | 3/2005 |
| JP | 2010-518660 A | 5/2010 |

* cited by examiner

*FIG. 3*

| FREQUENCY (Hz) | AMPLITUDE |
|---|---|
| 0 | 1.0000 |
| f | 0.9893 |
| 2f | 0.09684 |
| 3f | 0.9320 |
| 4f | 0.8809 |
| 5f | 0.8251 |
| 6f | 0.7548 |
| 7f | 0.6865 |
| 8f | 0.6073 |
| 9f | 0.5322 |
| 10f | 0.4491 |
| 11f | 0.3693 |
| ⋮ | ⋮ |
| $(n-1) \cdot f$ | 1.0000 |

FIG. 4

| FREQUENCY (Hz) | AMPLITUDE |
|---|---|
| 0 | 1.0000 |
| f | 1.0000 |
| 2f | 1.0000 |
| 3f | 1.0000 |
| 4f | 0.9990 |
| 5f | 0.9900 |
| 6f | 0.9800 |
| 7f | 0.9000 |
| 8f | 0.8000 |
| 9f | 0.6000 |
| 10f | 0.0000 |
| 11f | 0.0000 |
| ⋮ | ⋮ |
| $(n-1) \cdot f$ | 1.0000 |

*FIG. 5*

| FREQUENCY (Hz) | AMPLITUDE |
|---|---|
| 0 | 1.0000 |
| f | 1.0108 |
| 2f | 1.0326 |
| 3f | 1.0729 |
| 4f | 1.1341 |
| 5f | 1.1999 |
| 6f | 1.2984 |
| 7f | 1.3111 |
| 8f | 1.3173 |
| 9f | 1.1274 |
| 10f | 0.0000 |
| 11f | 0.0000 |
| ⋮ | ⋮ |
| $(n-1) \cdot f$ | 1.0000 |

*FIG. 6*

| AMPLITUDE | INVERSE CONVERSION OUTPUT |
|---|---|
| 1.8 | 2.50 (+8dB) |
| 1.6 | 2.00 (+6dB) |
| 1.4 | 1.56 (+4dB) |
| 1.2 | 1.26 (+2dB) |
| 1.0 | 1.0 (0dB) |
| 0.8 | 0.8 (-2dB) |
| 0.6 | 0.64 (-4dB) |
| 0.4 | 0.50 (-6dB) |
| 0.2 | 0.40 (-8dB) |

*FIG. 7*

| ADC OUTPUT | INVERSE CONVERSION OUTPUT |
|---|---|
| 63 | 2.50 (+8dB) |
| 55 | 2.00 (+6dB) |
| 46 | 1.56 (+4dB) |
| 38 | 1.26 (+2dB) |
| 31 | 1.0 (0dB) |
| 26 | 0.8 (-2dB) |
| 16 | 0.64 (-4dB) |
| 8 | 0.50 (-6dB) |
| 0 | 0.40 (-8dB) |

WIRELESS COMMUNICATION APPARATUS

TECHNICAL FIELD

The present invention relates to a wireless communication apparatus for correcting distortion of a signal occurring in a process of frequency conversion of a baseband signal and a high-frequency signal.

BACKGROUND ART

In wireless communication, distortion occurs in amplitude according to a frequency of a signal when performing up-conversion from a baseband signal of a transmission signal to a high-frequency signal and when performing down-conversion from a high-frequency signal of a reception signal to a baseband signal. Known means for correcting frequency characteristics of distortion is a frequency characteristic corrector of, for example, Patent Literature 1.

In the frequency characteristic corrector of Patent Literature 1, in signal transmission from a transmission system circuit., a part of the transmission signal is fetched by an integration circuit: and the transmission signal is divided into the low-frequency side and the high-frequency side in each band division filter, and an output (power level) of each filter is detected in each power detector. Further, the frequency characteristic corrector obtains desired frequency characteristics by controlling a variable equalizer circuit based on a voltage obtained by mutually comparing each of the outputs in a comparison circuit.

Consequently, in the frequency characteristic corrector, it becomes unnecessary to make manual adjustment to frequency characteristics for each device in which a change occurs in each signal level depending on a transmission frequency or a reception frequency, and it becomes unnecessary to use another equalizer circuit to a cable or an external connecting device, and thus desired frequency characteristics can be obtained.

CITATION LIST

Patent Literature

Patent Literature 1: JP-A-2001-16145

SUMMARY OF INVENTION

Technical Problem

However, particularly in millimeter-wave communication in which a broadband frequency is used, distortion occurs in amplitude of a signal to a working frequency in an analog circuit including, for example, an LNA section, a power amplifier section or a frequency converter of a baseband signal and a high-frequency signal.

When the frequency characteristic corrector of Patent Literature 1 is applied to millimeter-wave communication, frequency characteristics of signal distortion are linearly corrected based on a result of detection of a signal to frequency components of several points. Since distortion occurs in amplitude of the signal in a process of signal amplification of a broadband high-frequency signal or each frequency conversion of a baseband signal and a high-frequency signal, there was a problem of degrading communication characteristics greatly.

In communication in which a conventional narrowband frequency is handled, desired frequency characteristics can be obtained by correction of signal distortion, but in communication in which a broadband frequency including millimeter waves is handled, it is necessary to correct frequency characteristics of distortion in amplitude of a signal with higher accuracy.

The present invention has been implemented in view of the conventional circumstances described above, and an object of the present invention is to provide a wireless communication apparatus for correcting distortion of a signal occurring by frequency conversion between a baseband signal and a high-frequency signal with high accuracy in wireless communication in which a broadband frequency is handled.

Solution to Problem

The present invention provides a wireless communication apparatus including: a transmitter; a receiver; a test signal generator, configured to generate test signals of different frequencies; a DA converter, configured to perform a DA conversion of the generated test signal; a transmission RF section, configured to up-convert the DA-converted test signal into a high-frequency signal; a loop-back section, configured to perform an envelope detection of the high-frequency signal and input the high-frequency signal to the receiver; an AD converter, configured to perform an AD conversion of the inputted signal; an amplitude detector, configured to detect an amplitude component of the AD-converted signal; an inverse characteristic calculator, configured to calculate amplitude inverse characteristics based on characteristics of the detected amplitude; and an FIR filter, configured to correct a signal band of a transmission signal generated by the transmitter based on a calculated result of the inverse characteristic calculator.

Advantageous Effects of Invention

According to the present invention, distortion of a signal occurring by frequency conversion between a baseband signal and a high-frequency signal in wireless communication which uses a broadband frequency can be corrected with high accuracy.

BRIEF DESCRIPTION OF DRAWINGS

FIG. 3 is an explanatory diagram representing one example of an amplitude characteristic table.

FIG. 4 is an explanatory diagram representing one example of a reference amplitude characteristic table.

FIG. 5 is an explanatory diagram representing one example of an amplitude inverse characteristic table.

FIG. 6 is an explanatory diagram representing one example of an inverse conversion table.

FIG. 7 is an explanatory diagram representing another example of an inverse conversion table.

EMBODIMENTS OF INVENTION

Embodiments of the present invention will hereinafter be described with reference to the drawings.

(First Embodiment)

Figure 1:
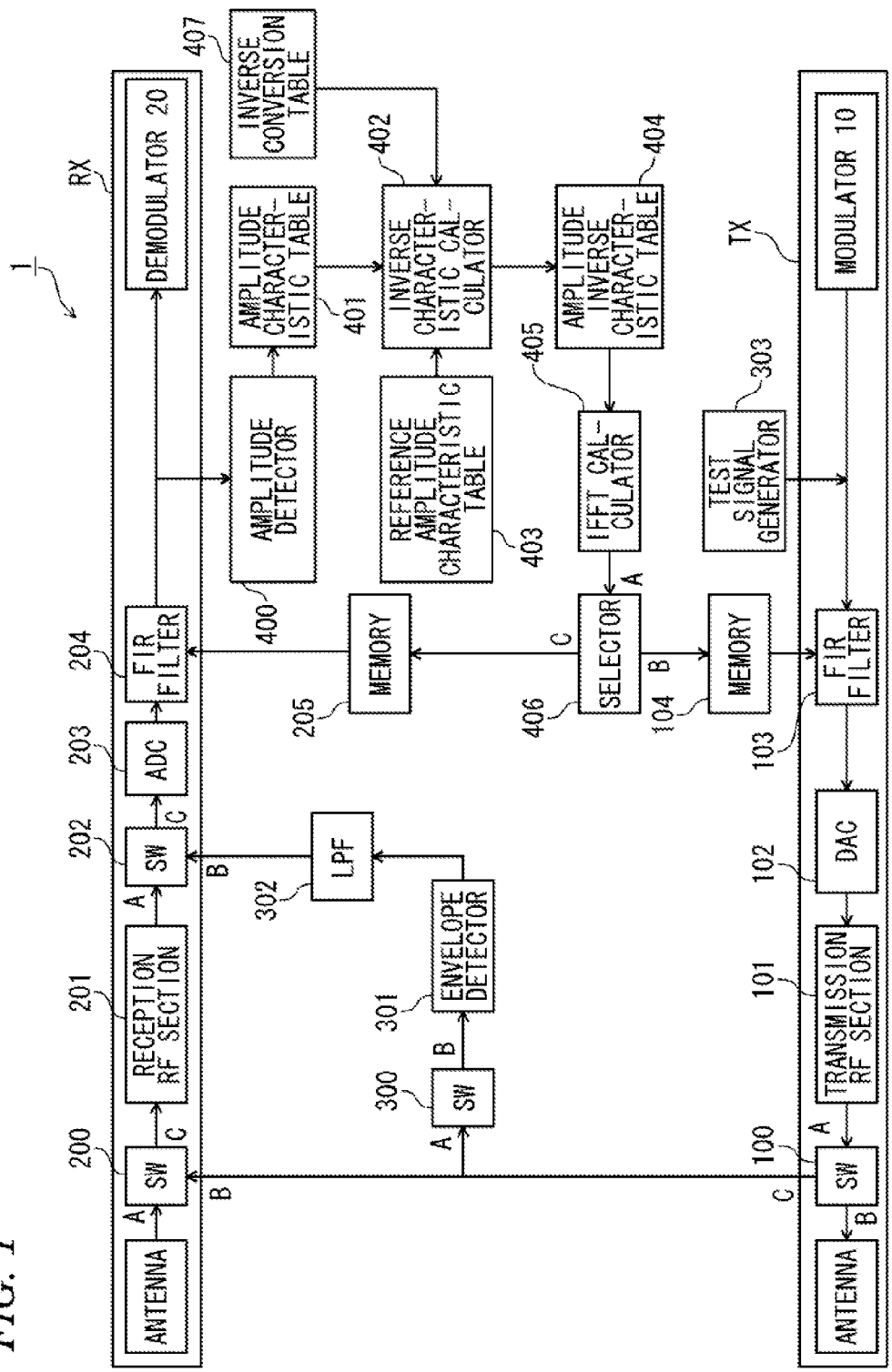
FIG. 1 is a block diagram representing an internal configuration of a wireless communication apparatus according to a first embodiment.

FIG. 1 is a block diagram representing an internal configuration of a wireless communication apparatus 1 according to a first embodiment of the present invention. The wireless communication apparatus 1 up-converts a transmission signal of a baseband generated by a modulator 10 and converts the transmission signal into a high-frequency signal in a transmission RF section 101, and transmits the high-frequency signal from an antenna.

In the first embodiment the wireless communication apparatus 1 corrects frequency characteristics of distortion of amplitude occurring in the transmission signal in the case of up-converting the transmission signal of the baseband into the high-frequency signal. The wireless communication apparatus 1 corrects amplitude of the transmission signal using a correction factor for correcting distortion of amplitude of the transmission signal in an FIR filter 103.

Further, in the first embodiment, the wireless communication apparatus 1 calculates the correction factor for correcting distortion of amplitude of the transmission signal using a tone wave of a predetermined frequency as a test signal.

Hereinafter, the frequency characteristics of distortion of amplitude occurring in the transmission signal in the case of converting the transmission signal of the baseband into the high-frequency signal are called "distortion characteristics of the transmission signal".

Next, a configuration of each section of the wireless communication apparatus 1 will be described.

The wireless communication apparatus 1 is configured to include a transmitter TX, a receiver RX, a switch (SW) 300, an envelope detector 301, an LPF (low pass filter) 302, a test signal generator 303, an amplitude detector 400, an inverse characteristic calculator 402, an IFFT calculator 405, a selector 406, a memory 104, and a memory 205 as represented in FIG. 1.

The transmitter TX is configured to include the modulator 10, a switch 100, the transmission RF section 101, a DAC (Digital Analog Converter) 102, the FIR (Finite Impulse Response) filter 103 and an antenna.

The receiver RX is configured to include a demodulator 20, a switch 200, a reception RF section 201, a switch 202, an ADC (Analog Digital Converter) 203, an FIR filter 204, and an antenna. In FIG. 1, the wireless communication apparatus 1 includes two antennas for transmission and reception, but may be configured to include single antenna for transmission and reception.

An amplitude characteristic table 401, a reference amplitude characteristic table 403 and an amplitude inverse characteristic table 404 respectively represented in FIG. 3, FIG. 4 and FIG. 5 described below are stored in the memory 104 or the memory 205. Also, the wireless communication apparatus 1 is configured to include, two of the memory 104 and memory 205, but may be configured to include the memory 104 and the memory 205 as single memory.

Next, operation of each section of the wireless communication apparatus 1 will be described.

The modulator 10 modulates a transmission signal using a predetermined modulation method, and outputs the transmission signal to the FIR filter 103.

The test signal generator 303 outputs a tone wave of a predetermined frequency, that is, a tone wave of k●f [Hz] to the FIR filter 103 as a test signal. A parameter k is an integer from 0 to (n−1). A parameter f represents a frequency.

Also, the test signal generator 303 increments the parameter k according to an input of an amplitude storage signal from the amplitude detector 400 described below, and outputs a tone wave of k●f to the FIR filter 103 until the parameter k reaches (n−1). In addition, an input of an arrow from the amplitude detector 400 to the test signal generator 303 is omitted in FIG. 1.

In addition, the wireless communication apparatus 1 can correct distortion characteristics of the transmission signal with higher accuracy as the total number n of tone waves used in the test signal generator 303 is larger. In addition, when a sampling frequency used in the wireless communication apparatus 1 is set at fs, a frequency f [Hz] of a fundamental tone wave is a frequency obtained by dividing fs [Hz] by n.

The FIR filter 103 corrects amplitude of a signal (transmission signal or test signal) inputted to the FIR filter 103 using a correction factor stored in the memory 104. The FIR filter 103 outputs the corrected signal to the DAC 102. In addition, an output signal from the FIR filter 103 is a digital signal. In addition, the FIR filter 103 does not correct amplitude of a tone wave at the time of correcting distortion characteristics of the transmission signal, that is, when a tone wave of 0 (zero) to (n−1) [Hz] is outputted from the test signal generator 303.

The DAC 102 converts the inputted digital signal into an analog signal, and outputs the analog signal to the transmission RF section 101.

The transmission RE section 101 converts (up-converts) the inputted analog signal into a high-frequency signal. In a conversion process of the transmission RF section 101, distortion depending on a frequency occurs in amplitude of the analog signal inputted to the transmission RF section 101. The transmission RF section 101 outputs the high-frequency signal to the switch 100.

The switch 100 includes three of port A, port B and port C, and while the wireless communication apparatus 1 calculates a correction factor for correcting distortion characteristics of the transmission signal, for example, continuity between the port A and the port C is established by a switch controller (not shown).

The switch 200 includes three of port A, port B and port C, and while the wireless communication apparatus 1 calculates the correction factor for correcting distortion characteristics of the transmission signal, for example, continuity between the port A and the port C is established by a switch controller (not shown).

The switch 300 includes two of port A and port B, and while the wireless communication apparatus 1 calculates the correction factor for correcting distortion characteristics of the transmission signal, for example, continuity between the port A and the port B is established by a switch controller (not shown).

Consequently, while the wireless communication apparatus 1 calculates the correction factor for correcting distortion characteristics of the transmission signal, an output signal (high-frequency signal) from the transmission RF section 101 is inputted to the envelope detector 301 through the switch 100 and the switch 300.

The envelope detector 301 detects an envelope of a high-frequency signal by squaring the inputted high-frequency signal. By detection of the envelope, electric power information about the inputted high-frequency signal is outputted as a DC component. The envelope detector 301 outputs the DC component to the switch 202 through the LPF 302.

The detected DC component can determine what distortion occurs in a test signal, that is, what change occurs in amplitude after a tone wave (test signal) of a frequency k●f is up-converted in the transmission RF section 101. In addition, a high-frequency component of an output signal from the envelope detector 301 is eliminated in the LPF 302.

The switch 202 includes three of port A, port B and port C, and while the wireless communication apparatus 1 calculates the correction factor for correcting distortion characteristics of the transmission signal, for example, continuity between the port A and the port C is established by a switch controller (not shown).

Consequently, the output signal from, the envelope detector 301 is inputted to the ADC 203 through the switch 202.

The ADC 203 converts the inputted signal into a digital signal, and outputs the signal to the FIR filter 204.

The FIR filter 204 corrects amplitude of a signal (test signal) inputted to the FIR filter 204 using a correction factor stored in the memory 205. The FIR filter 204 respectively outputs the corrected signal to the demodulator 20 and the amplitude detector 400. In addition, an output signal from the FIR filter 204 is a digital signal. In addition, the FIR filter 204 does not correct the amplitude of the signal inputted to the FIR filter 204 at the time of correcting distortion characteristics of the transmission signal, that is when a tone wave of 0 (zero) to (n−1) [Hz] is outputted from the test signal generator 303.

The amplitude detector 400 detects amplitude of the output signal from the FIR filter 204, and stores the detected amplitude and a frequency of a tone wave outputted by the test signal generator 303 in the amplitude characteristic table 401 (see FIG. 3). The amplitude detector 400 outputs an amplitude storage signal to the test signal generator 303 after the amplitude detected for each frequency of a test signal is stored in the amplitude characteristic table 401.

FIG. 3 is an explanatory diagram representing one example of the amplitude characteristic table 401. FIG. 3 represents a relation between a frequency of a test signal (tone wave) generated by the test signal generator 303 and distortion (amplitude change) occurring in the case of converting the test signal into a high-frequency signal by the transmission RF section 101.

FIG. 4 is an explanatory diagram representing one example of the reference amplitude characteristic table 403. FIG. 4 represents a relation between a frequency of a test signal (tone wave) generated by the test signal generator 303 and amplitude of a high-frequency signal in the case of converting the test signal into the high-frequency signal by the transmission BY section 101.

FIG. 5 is an explanatory diagram representing one example of the amplitude inverse characteristic table 404. FIG. 5 represents a relation between a frequency of a test signal (tone wave) generated by the test signal generator 303 and amplitude (inverse characteristic amplitude) for preventing distortion (amplitude change) from occurring in the case of converting the test signal into a high-frequency signal by the transmission RF section 101.

An inverse conversion table 407 is a table in which, for example, the inverse characteristic calculator 402 actually restores amplitude information in the transmission RF section 101 based on the amplitude information obtained by the amplitude detector 400. FIG. 6 is an explanatory diagram representing one example of the inverse conversion table 407. FIG. 7 is an explanatory diagram representing another example of the inverse conversion table 407. FIG. 6 shows an output value in the case of inversely converting amplitude as an output of the amplitude detector 400 into amplitude in the transmission RF section 101 as a high-frequency section by the inverse conversion table 407.

Figure 8:
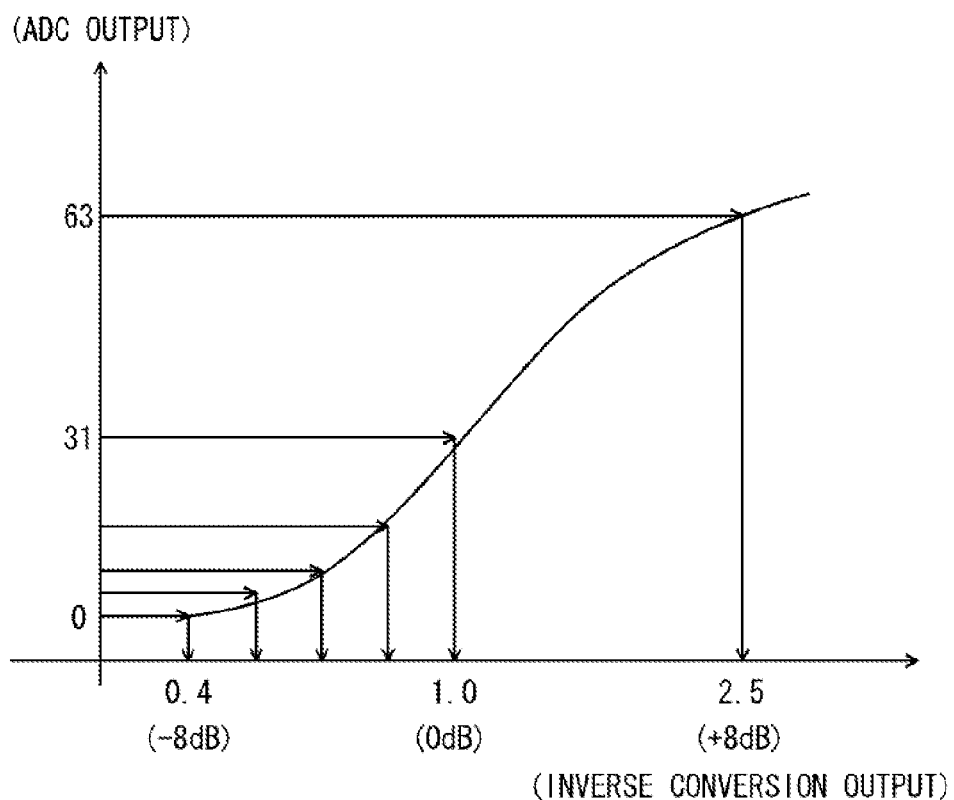
FIG. 8 is a graph showing one example of input-output characteristics of an envelope detector using the inverse conversion table.

Also, FIG. 7 shows an output value in the case of inversely converting an output (ADC code) of the ADC 203 into amplitude in the transmission RF section 101 as a high-frequency section by the inverse conversion table 407. The inverse conversion table 407 is a table for deriving inverse characteristics of input-output characteristics of the envelope detector 301 substantially (see FIG. 8). In derivation of the inverse conversion table 407, for example, broken line approximation is used as an inverse conversion manipulation. FIG. 8 is a graph showing one example of the input-output characteristics of the envelope detector 301 using the inverse conversion table 407.

The axis of ordinate of FIG. 8 is an ADC output, and the axis of abscissa of FIG. 8 is amplitude in the transmission RF section 101 inversely converted by the inverse conversion table 407. For example, when the ADC output is 63, the amplitude in the transmission RF section 101 becomes "2.5", that is, "+8 dB".

Also, when each output of the amplitude detector 400 or the ABC 203 does not match with the amplitude or the ADC output shown in FIG. 6 or FIG. 7, the inverse characteristic calculator 402 may calculate an output value of amplitude after inverse conversion by performing linear approximation based on values before or after the amplitude or the ADC output shown in FIG. 6 or FIG. 7.

The inverse characteristic calculator 402 calculates amplitude (inverse characteristic amplitude) in which amplitude stored in the amplitude characteristic table 401 for each frequency becomes amplitude stored in the reference amplitude characteristic table 403 for each frequency The inverse characteristic calculator 402 stores the calculated inverse characteristic amplitude in the amplitude inverse characteristic table 404, and further outputs the inverse characteristic amplitude to the IFFT calculator 405.

The IFFT calculator 405 calculates a filter coefficient (correction factor) for each frequency of a test signal by performing IFFT (inverse fast Fourier transformation) processing based on the amplitude (inverse characteristic amplitude) stored in the amplitude inverse characteristic table 404 for each frequency. The IFFT calculator 405 outputs the filter coefficient to the selector 406.

The filter coefficient calculated by the IFFT calculator 405 is a factor for correcting distortion of amplitude occurring in the case of converting the test signal into a high-frequency signal by the transmission RF section 101. In the wireless communication apparatus 1, the FIR filter 103 previously corrects amplitude of a signal in the transmission RF section 101 using a variable filter coefficient stored in the memory 104. The amplitude of the signal previously corrected becomes a value according to a frequency of the reference amplitude characteristic table 403 of FIG. 4 after being up-converted into a high-frequency signal in the transmission RF section 101.

The selector 406 stores a calculated result (filter coefficient) of the IFFT calculator 405 inputted to a port A in the memory 104 through a port B. In addition, the selector 406 selects connection between the port A and the port B while the wireless communication apparatus 1 calculates a correction factor for correcting distortion characteristics of a transmission signal.

Figure 2:
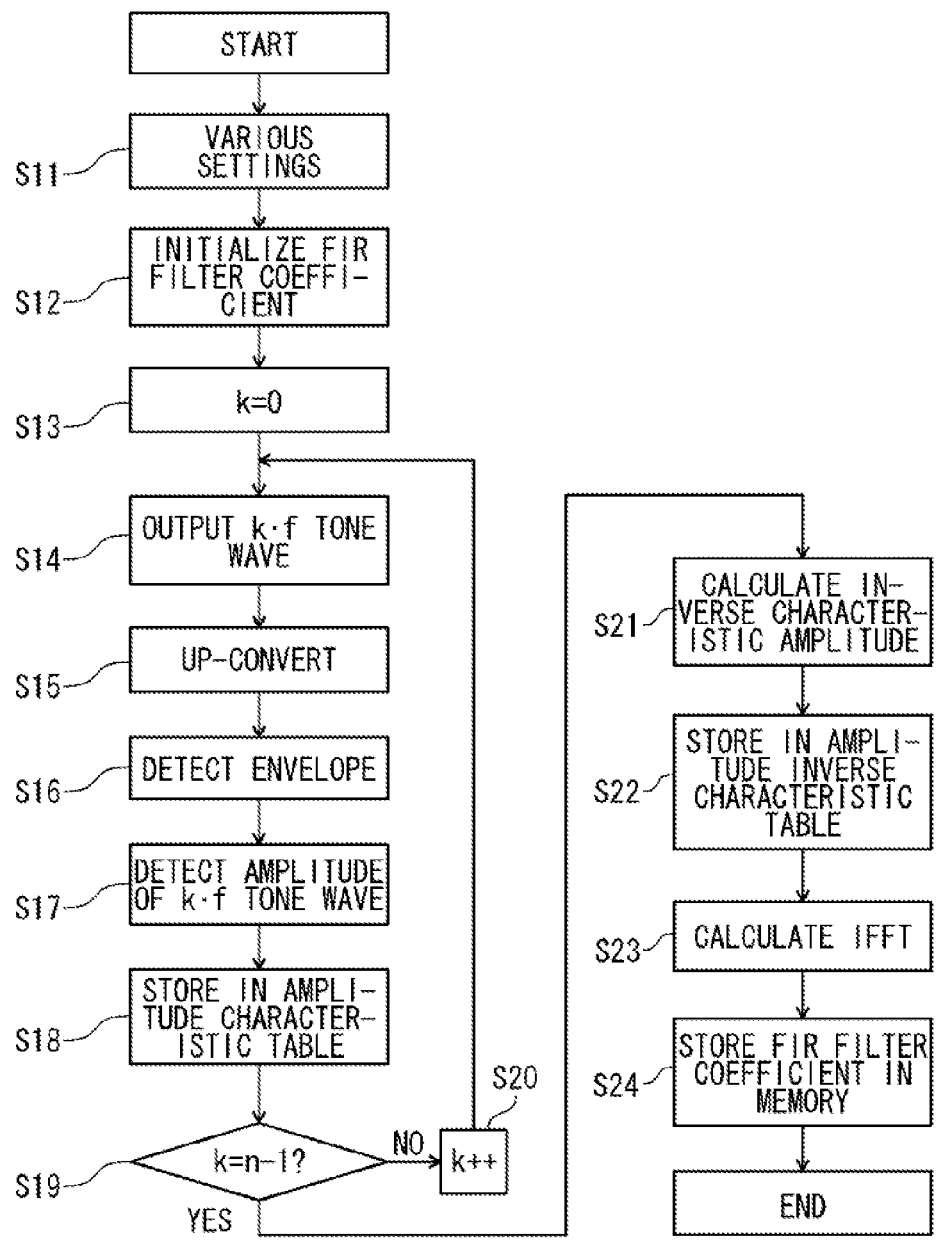
FIG. 2 is a flowchart, explaining operation of calculating a correction factor for correcting distortion of a transmission signal of the wireless communication apparatus 1 according to the first embodiment.

Next, operation in which the wireless communication apparatus 1 calculates a correction factor for correcting distortion of a transmission signal will he described with reference to FIG. 2. FIG. 2 is a flowchart explaining operation of calculating the correction factor for correcting the distortion of the transmission signal of the wireless communication apparatus 1 of the first embodiment.

In FIG. 2, the wireless communication apparatus 1 makes various settings, and continuity between the port A and the port C is established in the switch 100 and the switch 200, and continuity between the port A anti the port B is established in the switch 300 and further, continuity between the port B and the port C is established, in the switch 202 (S11). Further, the selector 406 selects connection between the port A and the port (S11).

The FIR filter 103 and the FIR filter 204 initialize each of the filter coefficients in the FIR filter 103 and the FIR filter 204 (S12). Accordingly, each of the amplitudes of the signals respectively inputted to the FIR filter 103 and the FIR filter 204 is not corrected.

The test signal generator 303 sets the parameter k at 0 (zero) (S13), and outputs a test signal of a frequency k●f [Hz] to the FIR filter 103 (S14). At the time of correcting distortion characteristics of the transmission signal, that is, when a tone wave of 0 (zero) to (n−1) [H] is outputted from the test signal generator 303, the FIR filter 103 does not correct amplitude of the tone wave, and outputs the signal to the DAC 102.

The DAC 102 converts the inputted digital signal into an analog signal, and outputs the analog signal to the transmission RF section 101.

The transmission RF section 101 up-converts the inputted analog signal into a high-frequency signal (S15). The high-frequency signal from the transmission RF section 101 is inputted to the envelope detector 301 through the switch 100 and the switch 300.

The envelope detector 301 detects an envelope of the high-frequency signal by squaring the inputted high-frequency signal (S16). By detection of the envelope, electric power information about the inputted high-frequency signal is outputted as a DC component. The envelope detector 301 outputs the DC component to the switch 202 through the LPF 302. An output signal from the envelope detector 301 is inputted to the ADC 203 through the switch 202.

The ADC 203 converts the inputted signal into a digital signal, and outputs the signal to the FIR filter 204.

At the time of correcting distortion characteristics of the transmission signal, that is, when a tone wave of 0 (zero) to (n−1) [Hz] is outputted from the test signal generator 303, the FIR filter 204 does not correct amplitude of the signal inputted to the FIR filter 204, and outputs the signal to the amplitude detector 400.

The amplitude detector 400 detects amplitude of the output signal from the FIR filter 204 (S17), and stores the detected amplitude and a frequency of a tone wave outputted by the test signal generator 303 in the amplitude characteristic table 401 (S18). The amplitude detector 400 outputs an amplitude storage signal to the test signal generator 303 after the amplitude detected for each frequency of a test signal is stored in the amplitude characteristic table 401.

When the parameter k does not reach (n−1) in step S19 (S19, NO), the wireless communication apparatus 1 increments the parameter k (S20), and repeats steps 514 to S18 until the parameter k reaches (n−1).

When the parameter k reaches (n−1) in step S19 (S19, YES), the inverse characteristic calculator 402 calculates inverse characteristic amplitude in which amplitude stored in the amplitude characteristic table 401 for each frequency becomes amplitude stored in the reference amplitude characteristic table 403 for each frequency (S21). The inverse characteristic calculator 402 stores the calculated inverse characteristic amplitude in the amplitude inverse characteristic table 404 (S22), and further outputs the inverse characteristic amplitude to the IFFT calculator 405.

The IFFT calculator 405 calculates a filter coefficient for each frequency of a test signal by performing IFFT processing based on the inverse characteristic amplitude stored in the amplitude inverse characteristic table 404 for each frequency (S23). The IFFT calculator 405 outputs the filter coefficient to the selector 406.

The selector 406 stores a calculated result (filter coefficient) of the IFFT calculator 405 inputted to the port A in the memory 104 through the port B (S24). In addition, continuity between the port A and the port B is established in the switch 100 after the filter coefficient which is the calculated result of the IFFT calculator 405 is stored in the memory 104 in the wireless communication apparatus 1.

Next, a simulation result of operation in the wireless communication apparatus 1 in the case of a sampling frequency fs=3.5 [GHz], a parameter n=32 (parameter k=0 to 31) and a frequency f=about 110 [MHz] will be described.

Figure 9:
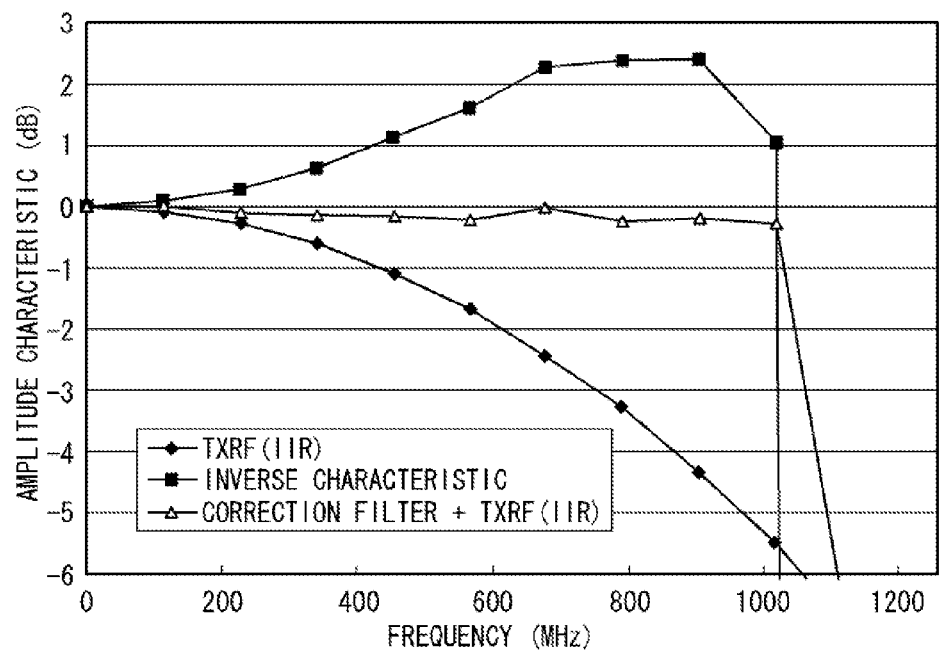
FIG. 9 is a simulation result of operation of the wireless communication apparatus according to the first embodiment.

FIG. 9 is a simulation result of operation of the wireless communication apparatus 1 of the first embodiment. In simulation FIG. 9, an IIR filter is adopted rather than the FIR filter.

In FIG. 9, a symbol (♦) represents amplitude of a signal detected by the amplitude detector 400. A symbol (■) represents inverse characteristic amplitude calculated by the inverse characteristic calculator 402. A symbol (Δ) represents amplitude of a signal corrected according to a filter coefficient which, is an IFFT processing result of the inverse characteristic amplitude stored in the amplitude inverse characteristic table 404.

In addition, an amplitude characteristic table, a reference amplitude characteristic table and an amplitude inverse characteristic table in the simulation of FIG. 9 are respectively represented in FIG. 3, FIG. 4 and FIG. 5. In FIG. 4, a level of amplitude of a signal at a desired frequency is set at 1, and 0 (zero) is set at frequencies at which signals are not present.

By the simulation result of FIG. 9, the wireless communication apparatus 1 according to the first embodiment: can correct distortion of a signal occurring in each frequency conversion between the baseband signal (the test signal or the transmission signal) and the high-frequency signal with high accuracy in wireless communication in which a broadband frequency is used. Further, by using the filter coefficient in the FIR filter 103, the wireless communication apparatus 1 can correct distortion characteristics occurring in the high-frequency signal in the transmission RF section 101 to obtain constant amplitude characteristics with respect to a desired frequency band.

(Second Embodiment)

Figure 10:
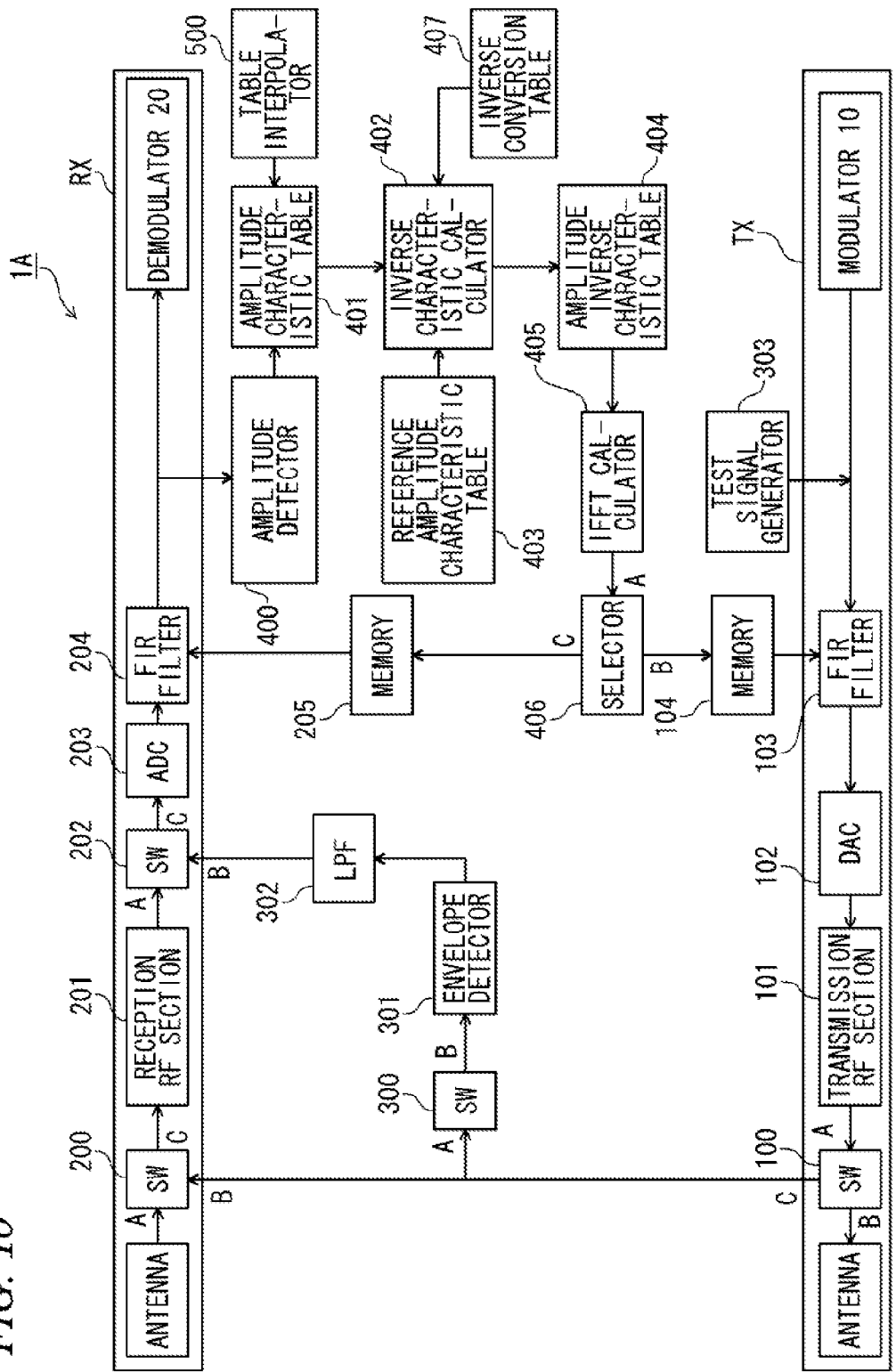
FIG. 10 is a block diagram representing an internal configuration of a wireless communication apparatus according to a second embodiment.
Figure 11:
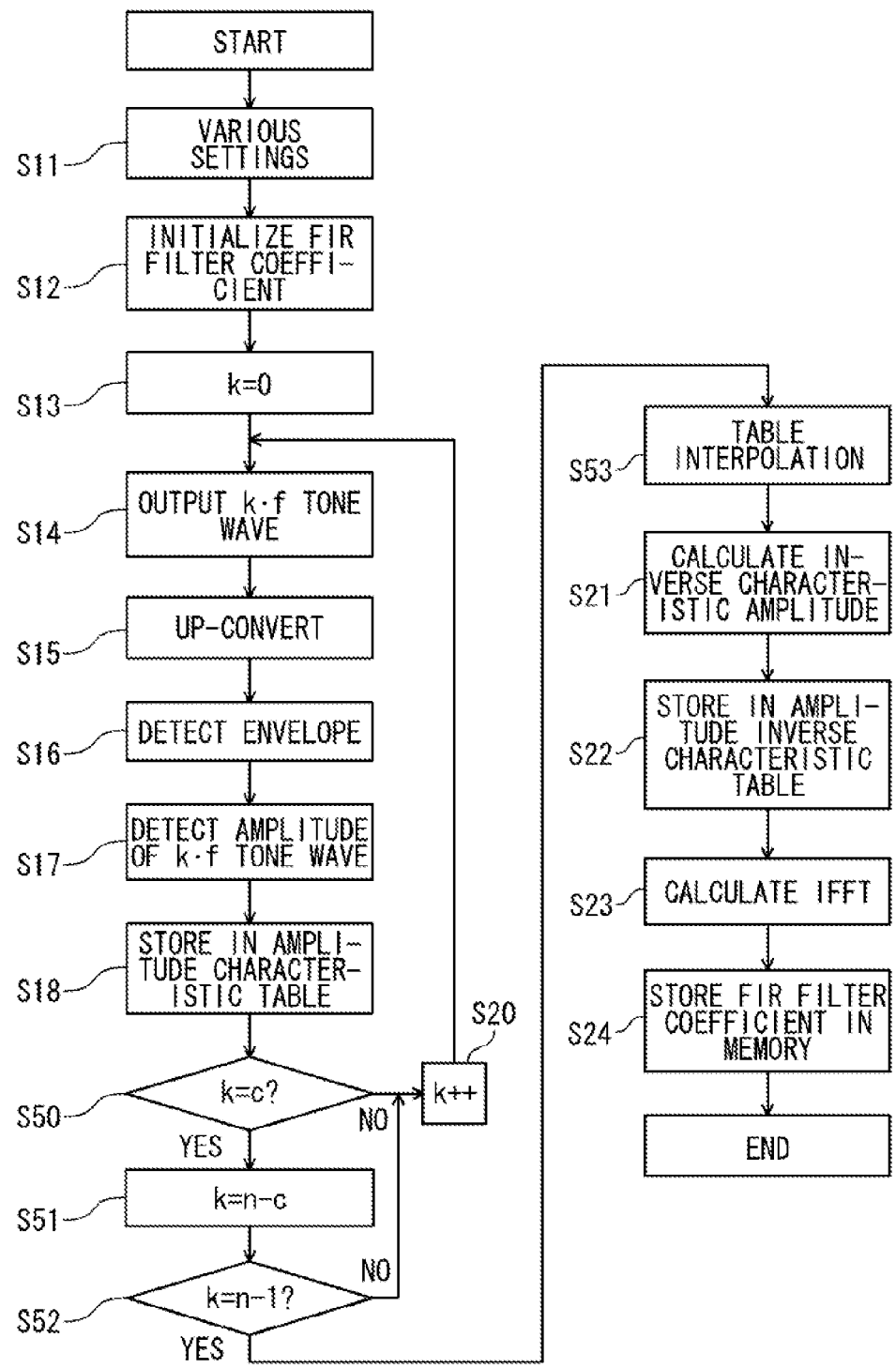
FIG. 11 is a flowchart explaining operation of calculating a correction factor for correcting distortion of a transmission signal of the wireless communication apparatus according to the second embodiment.

FIG. 10 is a block diagram representing an internal configuration of a wireless communication apparatus 1A according to a second embodiment. The block diagram of the wireless communication apparatus of FIG. 10 differs from that of the first embodiment (see FIG. 1) in that a table interpolator 500 is newly added. FIG. 11 is a flowchart explaining operation of calculating a correction factor for correcting distortion of a transmission signal of the wireless communication apparatus 1A according to the second embodiment.

In the second embodiment, a difference from the first embodiment will hereinafter be described.

In the second embodiment, the number of test signals generated in a test signal generator 303 differs. The first embodiment, generates n test signals of a frequency k●f [Hz]. In the second embodiment, test signals of b frequency components in the n test signals of the frequency k●f [Hz] are used as a frequency used in a transmission signal.

The test signal generator 303 outputs tone waves of b frequencies k●f [Hz] as test signals.

When a frequency band used in the transmission signal is a band ranging from −c●(fs/n) [Hz] to c●(fs/n) [Hz] herein, a frequency of the tone wave in which training is given by the test signal, that is, a correction factor for correcting distortion in a transmission RF section 101 to the test signal is calculated in the second embodiment becomes b=(2●c)+1.

In addition, a frequency of a band from −c●f [Hz] to −1●f [Hz] is equivalent to a frequency of a test signal from (n−c)●f [Hz] to (n−1)●f [Hz]. As a result, k becomes values of 0 to c (S13 to S50) and (n−c) to (n−1) (S51 to S52).

Like the first embodiment, a test signal generated in the test signal generator 303 is received in an antenna of a receiver RX through an antenna of a transmitter TX. The received test signal passes through a reception RF section 201, and amplitude characteristics of the reception RF section 201 are obtained in an amplitude detector 400. The amplitude characteristics detected by the amplitude detector 400 are inputted to an amplitude characteristic table 401.

Here, in a table value of a band which is not used in transmission of the transmission signal, some interpolated value is preferably used for optimally achieving band characteristics used in a filter from the standpoint of the possibility of frequency characteristics of the filter.

Here, since a reference level of the band which is not used in transmission of the transmission signal is set at zero in the first embodiment, sharp amplitude characteristics of the filter are obtained finally.

On the other hand, in the second embodiment, amplitude characteristics of the filter are obtained by interpolation described below, and characteristics of change in a signal out of a desired band become slow as the whole frequency characteristics like the first embodiment.

An interpolation method will hereinafter he described.

After amplitude characteristics of b frequency components are first acquired, the table interpolator 500 interpolates data of (n-b) amplitude characteristics in which amplitude characteristics are not acquired (S53).

As a precondition, a total of (2●c)+1 amplitude tables ranging from the first to (c+1)-th and from (n−c)-th to (n−1)-th in n frequency components in an amplitude characteristics table shall be already identified. The following three kinds of concrete interpolation methods of a total of (n-b) amplitude tables ranging from the remaining (c+2)-th to (n−c−1)-th and n-th in b=(2●c)+1 will be described.

The first interpolation method will be described. This method is a method in which a value interpolated by linear approximation using a (c+1)-th value and a (n−c)-th value is stored in the (c+2)-th to (n−c−1)-th and n-th.

The second interpolation method is a method for storing a constant value. The constant value may be the average value of a (c+1)-th value and a (n−c)-th value, or the average value of acquired values, or 1 of a normalized value.

The third interpolation method is a method for repeatedly inserting already acquired h amplitude data into the remaining tables by b multiples of b). In the case of repeatedly inserting the amplitude data, the method for repeatedly inserting the amplitude data with order of frequency arrangement inverted partially in order to maintain continuity of signals may be used.

Using the interpolation methods described above, the table interpolator 500 interpolates the amplitude characteristic table 401. A correction factor of the, filter is Obtained by performing the other operation like the first embodiment.

As described above, the wireless communication apparatus 1A according to the second embodiment acquires amplitude characteristics of a desired band, so that the time of a correction system can be shortened and also, correction performance can be enhanced.

(Third Embodiment)

The configuration of the wireless communication apparatus 1 of FIG. 1 can similarly be applied to a third embodiment. A wireless communication apparatus 1 down-converts a high-frequency reception signal received by an antenna and converts the reception signal into a baseband signal in a reception RF section 201, and demodulates and reproduces the baseband signal in a demodulator 20.

In the third embodiment, the wireless communication apparatus 1 corrects frequency characteristics of distortion occurring in the reception signal in the case of down-converting the high-frequency reception signal into the baseband signal. The wireless communication apparatus 1 corrects amplitude of the reception signal using a correction factor for correcting distortion of the reception signal in an FIR filter 204.

Further, the third embodiment is premised that distortion characteristics of a transmission signal described in the first embodiment described above are previously corrected. That is, it is premised that a filter coefficient of an FIR filter 103, namely, a correction factor for correcting distortion characteristics of the transmission signal is previously stored in a memory 104.

Further, in the third embodiment, the wireless communication apparatus 1 calculates the correction factor for correcting distortion of the reception signal using a tone wave of a predetermined frequency as a test signal like the first embodiment.

Hereinafter, the frequency characteristics of distortion occurring in the reception signal in the case of converting the high-frequency reception signal into the baseband signal are called "distortion characteristics of the reception signal".

Next, operation of each section of the wireless communication apparatus 1 will be described. Hereinafter, explanation of the contents similar to the operation of each section of the wireless communication apparatus 1 of the first embodiment is omitted, and the different contents are described.

A switch 100 includes three port A, port B and port C and while the wireless communication apparatus 1 calculates a correction factor for correcting distortion characteristics of the reception signal, for example, continuity between the port A and the port C is established by a switch controller (not shown).

A switch 200 includes three port A, port B and port C, and while the wireless communication apparatus 1 calculates the correction factor for correcting distortion characteristics of the reception signal, for example, continuity between the port B and the port C is established by a switch controller (not shown).

The reception RF section 201 converts (down-converts) a high-frequency reception signal received by an antenna or a high-frequency test signal inputted through the switch 100 and the switch 200 into a baseband signal. In a conversion process of the reception RF section 201, distortion according to a frequency occurs in amplitude of an analog signal inputted to the reception RF section 201. The reception RF section 201 outputs the baseband signal to a switch 202.

The switch 202 includes three port A, port B and port C, and while the wireless communication apparatus 1 calculates the correction factor for correcting distortion characteristics of the reception signal, for example, continuity between the port A and the port C is established by a switch controller (not shown).

The demodulator 20 demodulates and reproduces an output signal in which distortion characteristics of the reception signal are corrected by the FIR filter 204.

A selector 406 stores a calculated result. (filter coefficient) of an IFFT calculator 405 inputted to a port A in a memory 205 through a port C. In addition, the selector 406 selects connection between the port A and the port C while the wireless communication apparatus 1 calculates a correction factor for correcting distortion characteristics of the received transmission signal.

Figure 12:
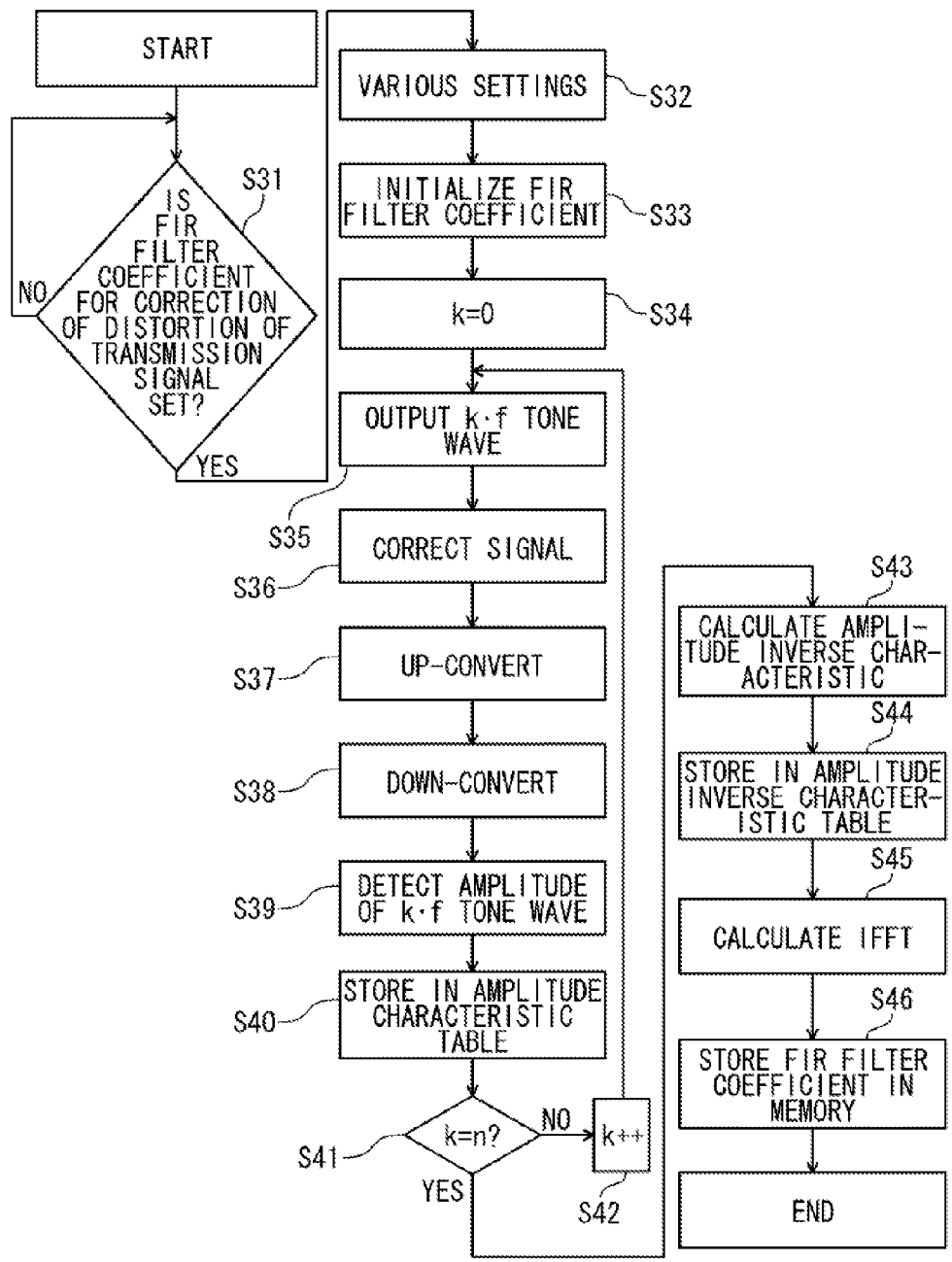
FIG. 12 is a flowchart explaining operation of calculating a correction factor for correcting distortion of a reception signal of a wireless communication apparatus according to a third embodiment.

Next, operation in which the wireless communication apparatus 1 calculates a correction factor for correcting distortion of a reception signal will be described, with reference to FIG. 12. FIG. 12 is a flowchart explaining operation of calculating the correction factor for correcting the distortion of the reception signal of the wireless communication apparatus 1 according to the third embodiment.

FIG. 12, on the premise that distortion characteristics of a transmission signal are previously corrected (S31, YES), the wireless communication apparatus I makes various settings, and continuity between the port A and the port C is established in the switch 100, and continuity between the port B and the port C is established in the switch 200 (832). Further, discontinuity between a port A and a port B is established in a switch 300, and continuity between the port A and the port C is established in the switch 202 (S32). Further, the selector 406 selects connection between the port A and the port C (S32).

Further, in the wireless communication apparatus 1, the FIR filter 103 sets a filter coefficient for correcting distortion characteristics of the transmission signal like the first embodiment. (S32). Amplitude of a test signal outputted by a test signal generator 303 is corrected in the FIR filter 103 in order to maintain the amplitude constant even after up-conversion in a transmission RF section 101.

The FIR filter 204 initializes each filter coefficient in the FIR filter 204 (S33). Accordingly, amplitude of a signal inputted to the FIR filter 204 is not corrected.

The test signal generator 303 sets a parameter k at 0 (zero) (S34), and outputs a test signal of a frequency k●f to the FIR filter 103 (835). The FIR filter 103 corrects amplitude of the test signal outputted from the test signal generator 303 according to the filter coefficient set in step 832 (S36), and outputs the signal to a DAC 102.

The DAC 102 converts the inputted digital signal into an analog signal, and outputs the analog signal to the transmission RF section 101.

The transmission RF section 101 up-converts the inputted analog signal into a high-frequency signal (S37). The high-frequency signal from the transmission RF section 101 is inputted to the reception RF section 201 through the switch 100 and the switch 200.

The reception RF section 201 down-converts the inputted high-frequency signal into a baseband signal (S38). An output signal (baseband signal) from the reception RF section 201 is inputted to an ADC 203 through the switch 202.

The ADC 203 converts the inputted signal into a digital signal, and outputs the signal to the FIR filter 204.

At the time of correcting distortion characteristics of the reception signal, that is, when a tone wave of 0 (zero) to (n−1) [Hz] is outputted from the test signal generator 303, the FIR filter 204 does not correct amplitude of the signal inputted to the FIR filter 204, and outputs the signal to an amplitude detector 400.

The amplitude detector 400 detects amplitude of the output signal from the FIR filter 204 (S39), and stores the detected amplitude and a frequency of a tone wave outputted by the test signal generator 303 in an amplitude characteristic table 401 (S40).

When the parameter k does not reach (n−1) in step S41 (S41, NO), the wireless communication apparatus 1 increments the parameter k (S42), and repeats steps S35 to S40 until the parameter k reaches (n−1).

When the parameter k reaches (n−1) in step S41 (S41, YES), an inverse characteristic calculator 402 calculates inverse characteristic amplitude in which amplitude stored in the amplitude characteristic table 401 for each frequency becomes amplitude stored in a reference amplitude characteristic table 403 for each frequency (S43). The inverse characteristic calculator 402 stores the calculated inverse characteristic amplitude in an amplitude inverse characteristic table 404 (S44), and further outputs the inverse characteristic amplitude to the IFFT calculator 405.

The IFFT calculator 405 calculates a filter coefficient for each frequency of a test signal by performing IFFT processing based on the inverse characteristic amplitude stored in the amplitude inverse characteristic table 404 for each frequency (S45). The IFFT calculator 405 outputs the filter coefficient to the selector 406.

The selector 406 stores a calculated result (filter coefficient) of the IFFT calculator 405 inputted, to the port A in the memory 205 through the port C (S46). In addition, continuity between the port A and the port C is established in the switch 200 after the filter coefficient which is the calculated result of the IFFT calculator 405 is stored in the memory 205 in the wireless communication apparatus 1.

As described above, the wireless communication apparatus 1 according to the third embodiment can correct distortion of a signal occurring in each frequency conversion between the baseband signal (the test signal or the transmission signal) and the high-frequency signal with high accuracy in wireless communication in which a broadband frequency is handled. Further, by using each of the filter coefficients in the FIR filter 103 and the FIR filter 204, the wireless communication apparatus 1 can correct distortion characteristics occurring in the high-frequency signal in the transmission RF section 101 and distortion characteristics occurring in the baseband signal in the reception RF section 201 to obtain constant amplitude characteristics with respect to a desired frequency band.

Figure 13:
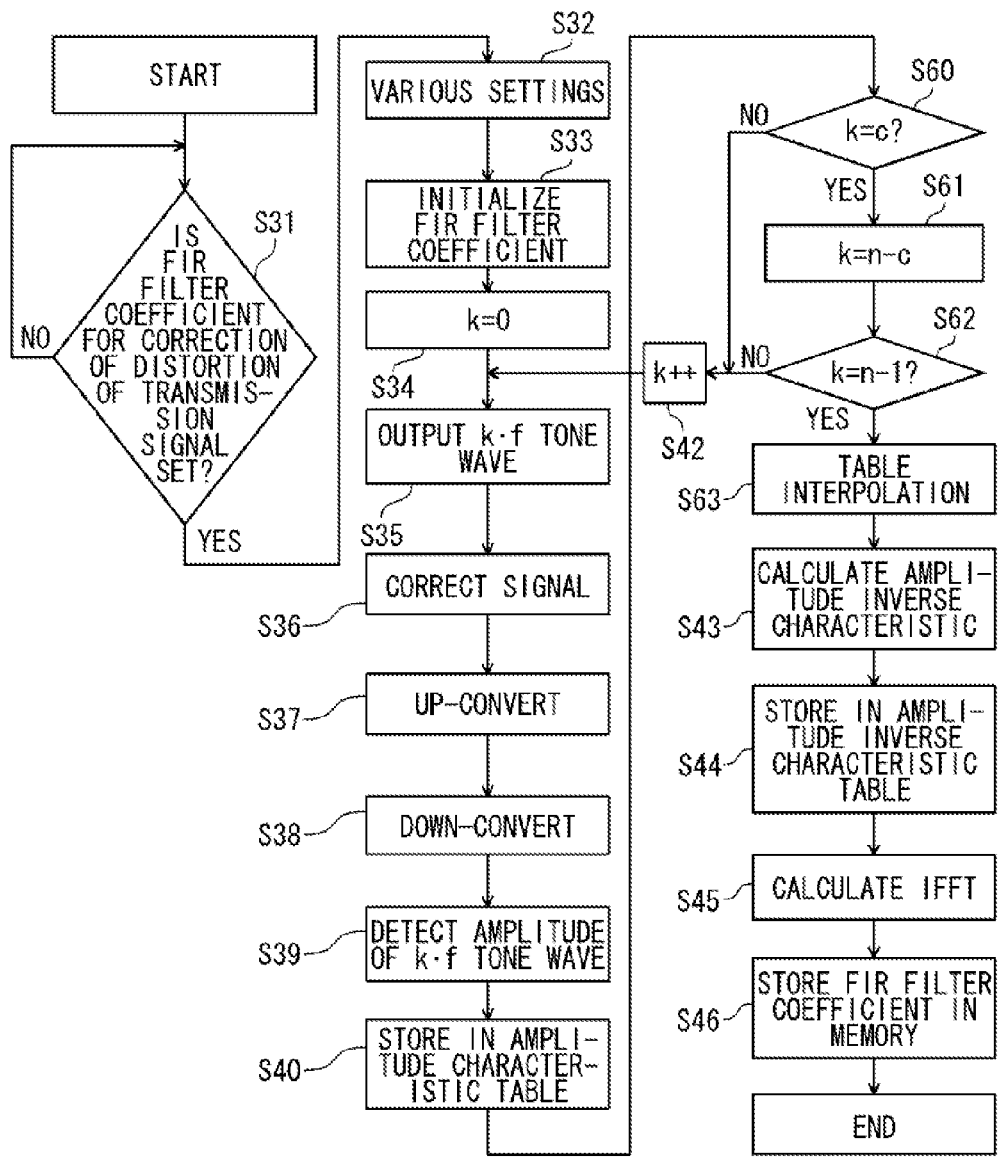
FIG. 13 is a flowchart explaining another operation of calculating the correction factor for correcting distortion of the reception signal of the wireless communication apparatus according to the third embodiment.

In addition, the wireless communication apparatus 1 according to the third embodiment may generate b (S34 to S62) tone waves equivalent to a band used for transmission of the transmission signal rather than n tone waves generated in the test signal generator 303 by a procedure of a flowchart of FIG. 13 using the table interpolator 500 of the wireless communication apparatus 1A of FIG. 10 in the second embodiment, and train amplitude characteristics of a desired band by the b tone waves of frequencies, and perform interpolation processing for a frequency in which amplitude characteristics are not acquired (S63). FIG. 13 is a flowchart explaining another operation of calculating a correction factor for correcting distortion of a reception signal of the wireless communication apparatus according to the third embodiment.

Accordingly, also in the wireless communication apparatus 1 of the third embodiment, amplitude characteristics similar to those of the wireless communication apparatus 1A of the second embodiment can be obtained and correction can be made at higher speed with higher accuracy.

(Fourth Embodiment)

Figure 14:
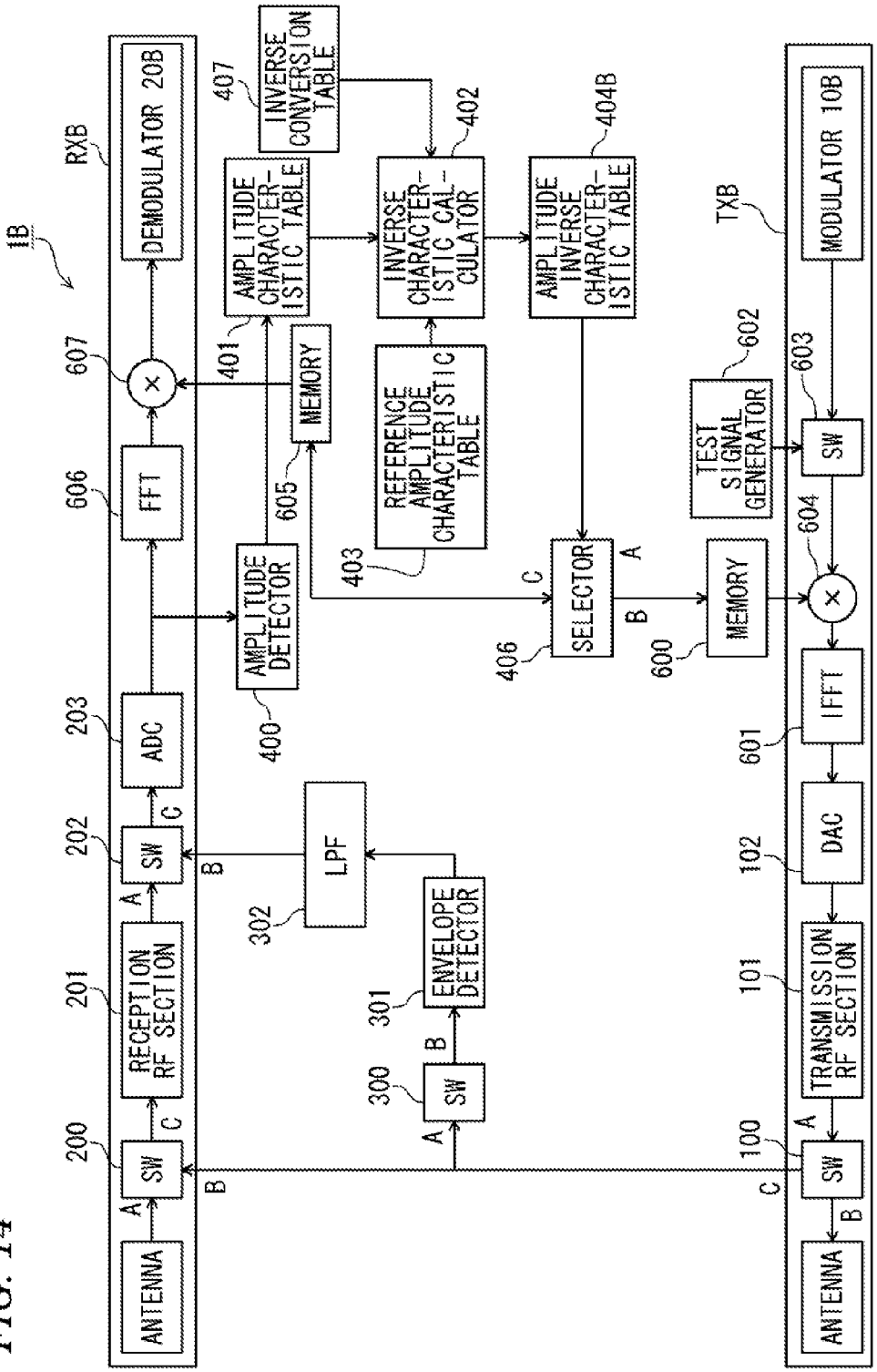
FIG. 14 is a block diagram representing an internal configuration of a wireless communication apparatus according to a fourth embodiment.

A wireless communication apparatus 1B according to a fourth embodiment will be described with reference to FIG. 14. FIG. 14 is a bloc diagram representing an internal configuration of the wireless communication apparatus 1B according to the fourth embodiment. Explanation is omitted by assigning the same numeral to each section operating like each of the first to third embodiments in each section of the wireless communication apparatus 1B.

The wireless communication apparatus 1B according to the fourth embodiment differs from the wireless communication apparatus 1, 1A of each of the first to third embodiments in that a transmitter TXB and a receiver RXB modulate and demodulate a signal on a frequency domain. That is, in the fourth embodiment, the wireless communication apparatus 1B modulates and demodulates the signal on the frequency domain, and corrects an amplitude deviation of a transmission and reception band.

In each of the first to third embodiments, the FIR filters 103, 204 correct amplitude of a transmission and reception band in a time domain signal to transmission signal, a reception signal). In the fourth embodiment, the wireless communication apparatus 1B corrects an amplitude deviation of the transmission and reception band by multiplying each frequency component of a frequency axial signal on a frequency domain by a correction factor stored in an amplitude inverse characteristic table 404B. For a training period, the correction factor stored in the amplitude inverse characteristic table 404B is previously calculated by training similar to that of each of the first to third embodiments and is stored in a memory 600 or a memory 605 through a selector 406.

The transmitter TXB is configured to include a modulator 10B, a switch 603, a multiplier 604, an IFFT section 601, a DAC 102, a transmission RF section 101, a switch 100, and an antenna. The multiplier 604 performs multiplication of a correction factor in the transmitter TXB.

The receiver RXB is configured to include an antenna, a switch 200, a reception RF section 201, a switch 202, an ADC 203, an FFT section 606, a multiplier 607, and a demodulator 20B. The multiplier 607 performs multiplication of a correction factor in the receiver RXB.

The modulator 10B modulates and generates a transmission signal on a frequency domain rather than a transmission signal on a time domain in each of the first to third embodiments. Similarly, the demodulator 20B demodulates a reception signal on the frequency domain rather than a reception signal on the time domain in each of the first to third embodiments.

In the transmitter TXB, an output signal from the modulator 10B or a test signal generator 602 is inputted to the switch 603, and a test signal of the test signal generator 602 is outputted from the switch 603 by a switch controller (not shown) for a training period.

The test signal generator 602 transmits a test signal of a CW wave (continuous wave) on the time domain in each of the first to third embodiments, but outputs a test signal of a CW wave on the frequency domain in the present embodiment.

The multiplier 604 multiplies each frequency component of a signal (a test signal or a modulated signal) from the switch 603 by a correction factor stored in the memory 600. The multiplier 604 outputs a signal after multiplication of the correction factor to the IFFT section 601. The IFFT section 601 converts a transmission signal on the frequency domain outputted from the multiplier 604 into a transmission signal on the time domain by inverse Fourier transformation, and outputs the transmission signal on the time domain to the DAC 102.

In the receiver RXB, a reception signal on the time domain outputted from the ADC 203 is inputted to the FFT section 606 and an amplitude detector 400, and is converted into a reception signal on the frequency domain by the FFT section 606. In addition, illustration is not given in FIG. 14, but a switch may be formed between the ADC 203 and the EFT section 606 or a branch section to the amplitude detector 400 to output an output signal of the ADC 203 to the amplitude detector 400 through the same switch by a switch controller (not shown) for a training period.

The FFT section 606 converts the output signal of the ADC 203, that is, the reception signal on the time domain into the reception signal on the frequency domain by Fourier transformation, and outputs the reception signal on the frequency domain to the multiplier 607.

The multiplier 607 multiplies each frequency component of a signal from the FFT section (306 by a correction factor stored in the memory 605. The multiplier 607 outputs a signal after multiplication of the correction factor to the demodulator 20B.

Correction of an amplitude deviation of a transmission and reception band, is essentially equivalent in any of correction of an amplitude deviation of a time domain signal using the FIR filters 103, 204 in each of the first to third embodiments and correction of an amplitude deviation in which a frequency component of a frequency axial signal is multiplied by the correction factor in the present embodiment.

Next, a difference from correction of an amplitude deviation of a time domain signal in each of the first to third embodiments will be described. In each of the first to third embodiments, a TAP factor of the FIR filter used in correction of the amplitude deviation in the time domain signal, that is a calculated result (filter coefficient) of the IFFT calculator 405 is stored in the memory 104, 205.

In the present embodiment, a value calculated by an inverse characteristic calculator 402 and stored in the amplitude inverse characteristic table 40413 is used as the correction factor used in correction of the amplitude deviation in the frequency axial signal. As a result, in the present embodiment, the need for the IFFT calculator 405 for calculating the filter coefficient for band correction is eliminated instead of adding the IFFT section 601 to the transmitter TXB and adding the FFT section 606 to the receiver RXB.

As described above, the wireless communication apparatus 1B of the present embodiment can have a high affinity in the case of modulating and demodulating a signal on the frequency domain rather than specifications of modulating and demodulating a signal on the time domain in wireless communication.

(Fifth Embodiment)

A wireless communication apparatus 1C according to a fifth embodiment will be described with reference to FIG. 15.

Figure 15:
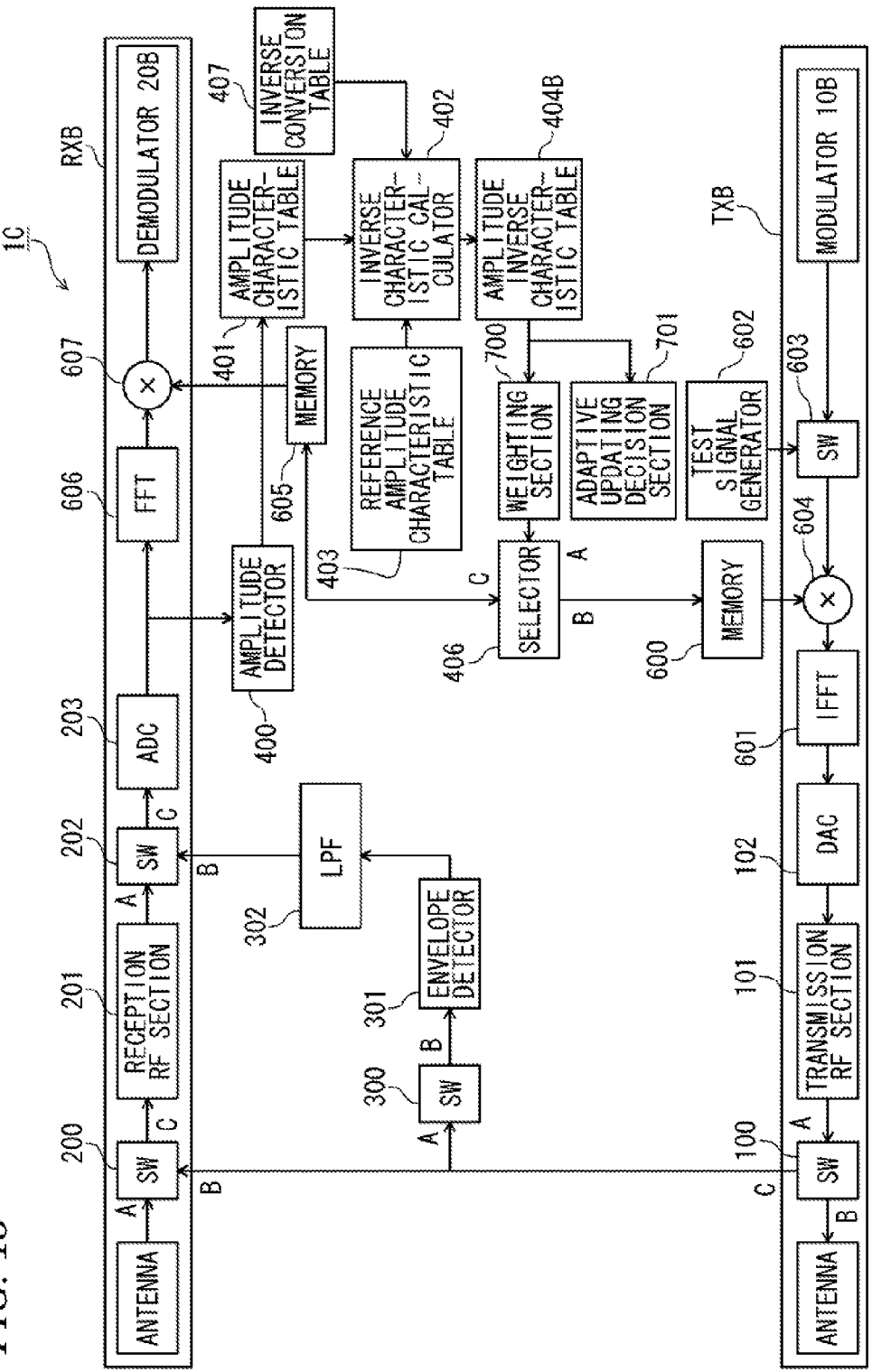
FIG. 15 is a block diagram representing an internal configuration of a wireless communication apparatus according to a fifth embodiment.

FIG. 15 is a block diagram representing an internal configuration of the wireless communication apparatus 1C according to the fifth embodiment. Explanation is omitted by assigning the same numeral to each section operating like the wireless communication apparatus 1B according to the fourth embodiment in each section of the wireless communication apparatus 1C.

The wireless communication apparatus 1C of the present embodiment is configured to further include a weighting section 700 and an adaptive updating decision section 701 as compared with the wireless communication apparatus 1B according to the fourth embodiment. In each of the first to fourth embodiments, acquisition of amplitude characteristics for correcting an amplitude deviation in a signal of a transmission and reception band and calculation of a filter coefficient or a correction factor were performed one time. In the present embodiment, acquisition of amplitude characteristics and calculation of a filter coefficient or a correction factor are performed plural times.

The weighting section 700 calculates a value (correction factor) of an amplitude inverse characteristic table to be next set based on a value calculated by an inverse characteristic calculator 402 and preserved in an amplitude inverse characteristic table 404B previous time and a value calculated by the inverse characteristic calculator 402 and preserved in the amplitude inverse characteristic table 404B this time.

For example, when a value (previous amplitude inverse characteristic value) calculated by the inverse characteristic calculator 402 and preserved in the amplitude inverse characteristic table 404B previous time is "1.8" and a value (this amplitude inverse characteristic value) calculated by the inverse characteristic calculator 402 and preserved in the amplitude inverse characteristic table 404B this time is "1.2" for an amplitude component of a frequency f, a correction factor is weighted by calculation of "$\{(1.8-1.2)\times\mu\}+1.2$". $\mu$ is a weighting parameter and is a value ranging from 0 to 1. Accordingly, the wireless communication apparatus 1C can prevent a correction convergent response of an amplitude deviation from becoming sharp to smooth the correction convergent response of the amplitude deviation.

The adaptive updating decision section 701 decides whether or not acquisition of amplitude characteristics and calculation of a correction factor are completed. For example, the adaptive updating decision section 701 decides whether or not the acquisition of the amplitude characteristics and the calculation of the correction factor are completed by referring to a value of the amplitude inverse characteristic table.

Concretely, the adaptive updating decision section 701 calculates an amplitude value after correction based on the latest correction factor calculated by the inverse characteristic calculator 402, and decides that the calculation of the correction factor (adaptive updating) is completed when the amplitude value is included in a predetermined range. In the case of deciding that calculation of a correction factor in a signal of the same frequency is completed, the adaptive updating decision section 701 makes a test signal generator 602B output a test signal of the next frequency and continue to calculate a correction factor in a signal of the maximum frequency targeted for training.

In the case of deciding that the calculation of the correction factor in the signal of the same frequency is continued, the adaptive updating decision section 701 makes the test signal generator 602B output a test signal of the same frequency. In addition, in the case of deciding that calculation of the correction factor in the signal of the maximum frequency is completed, the adaptive updating decision section 701 makes the test signal generator 602B complete an output of the test signal.

Accordingly, the wireless communication apparatus 1C can correct an amplitude deviation of the signal by the second and subsequent corrections with respect to an error which is not fully corrected by the first correction, so that the amplitude deviation in the signal of a transmission and reception band can be corrected with high accuracy. Also, the amplitude inverse characteristic table 404B can be simplified by adaptive updating of the adaptive updating decision section 701.

In addition, an inverse conversion table 407 is used for performing inverse conversion into amplitude in a reception RE section 201 or a transmission RF section 101 as a high-frequency section using an output of an envelope detector 301. When conversion into amplitude in the envelope detector 301 is made ideally, an amplitude error does not occur, but non-ideal conversion is made practically, so that an error occurs in correction of amplitude.

The inverse characteristic calculator 402 can correct the error by conversion in the envelope detector 301 by converting amplitude into amplitude in the reception RE section 201 or the transmission RE section 101 based on an output of an ADC 203 or an amplitude detector 400 using the inverse conversion table 407.

The various embodiments have been described above with reference to the drawings, but it goes without saying that the present invention is not limited to such examples. It is apparent to those skilled in the art that various change examples or modified examples can be reached within the scope described in the claims, and it is understood that their change examples or modified examples naturally belong to the technical scope of the present invention.

In addition, like the wireless communication apparatus 1A of the third embodiment, the wireless communication apparatus 1B, 1C of each of the fourth and fifth embodiments described above may correct band correction (correction of distortion characteristics) of a reception signal, that is, an amplitude deviation of the reception signal when band correction (correction of distortion characteristics) of a transmission signal, that is, an amplitude deviation of the transmission signal is corrected.

The present application is based on Japanese patent application (patent application No. 2011-080288) filed on Mar. 31, 2011, the contents of which are incorporated herein by reference.

INDUSTRIAL APPLICABILITY

A wireless communication apparatus according to the present invention is useful as a wireless device capable of correcting hands of transmission and reception.

REFERENCE SIGNS LIST

101: TRANSMISSION RF SECTION
102: DA CONVERTER
103: FIR FILTER
104: MEMORY
201: RECEPTION RF SECTION
203: AD CONVERTER
204: FIR FILTER
205: MEMORY
301: ENVELOPE DETECTOR
302: LPF
303: TEST SIGNAL GENERATOR
400: AMPLITUDE DETECTOR

401: AMPLITUDE CHARACTERISTIC TABLE
402: INVERSE CHARACTERISTIC CALCULATOR
403: REFERENCE AMPLITUDE CHARACTERISTIC TABLE
404: AMPLITUDE INVERSE CHARACTERISTIC TABLE
405: IFFT CALCULATOR
406: SELECTOR

The invention claimed is:

1. A wireless communication apparatus comprising:
a modulator, configured to generate a broadband transmission signal;
a test signal generator, configured to iteratively generate a sequence of test signals, the sequence of test signals each having a respectively different frequency component within a channel of the broadband transmission signal;
a Digital to Analog (DA) converter, configured to perform a DA conversion of the generated sequence of test signals and the broadband transmission signal;
a transmission Radio Frequency (RF) section, configured to up-convert the sequence of DA-converted test signals into a sequence of high-frequency test signals, and up-convert the DA-converted broadband transmission signal into a high-frequency broadband transmission signal;
a transmission antenna, configured to transmit the high-frequency broadband transmission signal;
a reception antenna, configured to receive a second high-frequency broadband transmission signal;
a loop-back section, configured to perform an envelope detection of the sequence of high-frequency test signals;
an Analog to Digital (AD) converter, configured to perform an AD conversion of the envelope detected sequence of test signals inputted from the loop-back section;
an amplitude detector, configured to detect an amplitude component of each of the AD-converted sequence of test signals with respect to the different frequency components of the iteratively generated sequence of test signals;
an inverse characteristic calculator, configured to calculate amplitude inverse characteristics of the AD-converted sequence of test signals based on characteristics of the detected amplitude components;
an IFFT calculator, configured to perform an inverse Fourier transformation of the calculated amplitude inverse characteristics; and
a Finite Impulse Response (FIR) filter, configured to correct an amplitude of each of the frequency components, within the channel, of the broadband transmission signal based on variable factors, the variable factors being the results of the inverse Fourier transformation of the calculated amplitude inverse characteristics.

2. The wireless communication apparatus according to claim 1, further comprising:
a second loop-back section, configured to input the sequence of high-frequency test signals to a reception RF section;
the reception RF section, configured to down-convert the sequence of high-frequency test signals into a sequence of received baseband-frequency test signals, and down-convert the received second high-frequency broadband transmission signal into a received baseband-frequency broadband transmission signal;
the AD converter further configured to perform AD conversion of the sequence of received baseband-frequency test signals, and perform AD conversion of the received baseband-frequency broadband transmission signal; and
a second FIR filter, configured to correct a signal band of the AD-converted received baseband-frequency broadband transmission signal, the correction of the signal band of the AD-converted received baseband-frequency broadband transmission signal is based on the variable factors or the AD converted sequence of received baseband-frequency test signals.

3. The wireless communication apparatus according to claim 1, wherein:
the iteratively generated sequence of test signals are tone waves, and
the envelope detected sequence of test signals are DC signals.

4. The wireless communication apparatus according to claim 1, wherein adjoining frequency components of the iteratively generated sequence of test signals within the channel of the broadband transmission signal have an equal frequency interval with respect to each other.

5. The wireless communication apparatus according to claim 1, wherein the FIR filter corrects the amplitude of each of the frequency components to obtain constant amplitude characteristics with respect to the broadband transmission signal.

* * * * *